United States Patent
Kobatake

(10) Patent No.: US 7,518,936 B2
(45) Date of Patent: Apr. 14, 2009

(54) SEMICONDUCTOR INTEGRATED CIRCUIT DEVICE AND INSPECTION METHOD OF THE SAME

(75) Inventor: Hiroyuki Kobatake, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 259 days.

(21) Appl. No.: 11/369,989

(22) Filed: Mar. 8, 2006

(65) Prior Publication Data

US 2006/0221731 A1 Oct. 5, 2006

(30) Foreign Application Priority Data

Mar. 11, 2005 (JP) ............................... 2005-069528

(51) Int. Cl.
*G11C 29/00* (2006.01)
(52) U.S. Cl. .................. 365/200; 365/201; 365/230.03
(58) Field of Classification Search ................. 365/200, 365/201, 230.03, 189.07, 189.08, 191, 241
See application file for complete search history.

(56) References Cited

U.S. PATENT DOCUMENTS 5,995,731 A * 11/1999 Crouch et al. ................... 716/4
7,155,643 B2 * 12/2006 Ichikawa ..................... 714/710
7,174,489 B2 * 2/2007 Sadakata et al. ............ 714/719
2003/0177415 A1 * 9/2003 Togashi et al. ................. 714/30
2005/0018514 A1 * 1/2005 Collura et al. ........... 365/225.7

FOREIGN PATENT DOCUMENTS

JP 2004-310951 11/2004

* cited by examiner

*Primary Examiner*—Dang T Nguyen
(74) *Attorney, Agent, or Firm*—McGinn IP Law Group, PLLC

(57) ABSTRACT

A semiconductor integrated circuit device includes: a plurality of memories and a judgement circuit. Each of plurality of memories is configured to include a Built-in Self Test (BIST) circuit that examines a possibility of repairing a defect and outputs a repair possibility signal indicating the possibility. The judgement circuit is configured to judge whether or not all of the plurality of memories can be repaired based on a plurality of the repair possibility signals. Each of the plurality of the repair possibility signals is outputted from one of the plurality of memories.

22 Claims, 5 Drawing Sheets

REDUNDANT BIT LINE BR

REDUNDANT BIT LINE BR

SEMICONDUCTOR INTEGRATED CIRCUIT DEVICE AND INSPECTION METHOD OF THE SAME

BACKGROUND OF THE INVENTION

1. Field of the Invention

The present invention relates to a semiconductor integrated circuit device and an inspection method of the same. More particular, the present invention relates to a semiconductor integrated circuit device provided with a memory having redundant cells, and an inspection method of the same.

2. Description of the Related Art

In a field of a semiconductor integrated circuit device (LSI), a BIST (Built-in Self Test) is known as a technique aimed at reducing a test time of a memory. According to the technique, a BIST circuit that generates a test pattern for inspection and judges whether an output corresponding to the test pattern can be obtained, is built into a chip in advance. When inspecting the memory, it is detected whether a trouble is present with respect to the memory as a whole by making the BIST circuit operate, and the result is then outputted.

Also, a redundancy method is known as a technique to improve an yield of a memory. According to this technique, redundant cells, and repair word lines and repair bit lines, are provided in a memory cell array in advance. A defective memory cell is repaired, by replacing a word line or bit line connected to the defective memory cell with a repair word line or repair bit line.

Japanese Laid Open Patent Application JP-P2004-310951A discloses a semiconductor integrated circuit device having a repair possibility judgment function for judging whether a memory is repairable or not. The memory has one pair of repair redundant lines in a column direction. A test pattern generation section generates a particular test pattern for the memory. A comparison section reads outputs of the memory, to judge whether or not a defective cell is present in the memory. A first data storage section is used to take a signal inputted from the test pattern generation section to the memory, and a right-and-wrong judgement signal in every bit from the comparison section in testing the memory, and is used to observe an input signal to the memory in testing logic around the memory. A second data storage section inputs an output signal of the comparison section, and shows presence or absence of a failure. In accordance with a value of the second data storage section, a data kept in the first data storage section is held. A repair possibility judgement section judges whether the memory is repairable, based on the input of which is the input to the first data storage section and the output of the first data storage section.

The number of memories built into a single semiconductor chip is increasing in recent years, the number reaching 100 to 200 in some cases. If a test of a memory is separately conducted for each memory, time for inspection is enormous. When ten memories are included in a single chip for example, a test needs to be repeated ten times for the single chip. In addition, the test has to be repeated for whole ten times for almost all chips, since the number of chips having defects is very small. A technique is needed that can reduce a test time of a memory.

According to a semiconductor integrated circuit device and an inspection method of the same, of the present invention, a test time of a memory can be reduced.

SUMMARY OF THE INVENTION

In order to achieve an aspect of the present invention, the present invention provides a semiconductor integrated circuit device including: a plurality of memories, each of which is configured to include a Built-in Self Test (BIST) circuit that examines a possibility of repairing a defect and outputs a repair possibility signal indicating the possibility; and a judgement circuit configured to judge whether or not all of the plurality of memories can be repaired based on a plurality of the repair possibility signals, each of which is outputted from one of the plurality of memories.

According to the semiconductor integrated circuit device of the present invention, since each of the plurality of memories has the BIST circuit, the BIST test can be simultaneously conducted for all the memories. Consequently, the time for testing the memory is reduced. Also, since the judgement circuit can collectively judge the repair possibility of all the memories based on all plurality of the repair possibility signals, the time for inspection is reduced.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

Embodiments of a semiconductor integrated circuit device and an inspection method of the same according to the present invention will be described below with reference to the attached drawings.

Figure 1:
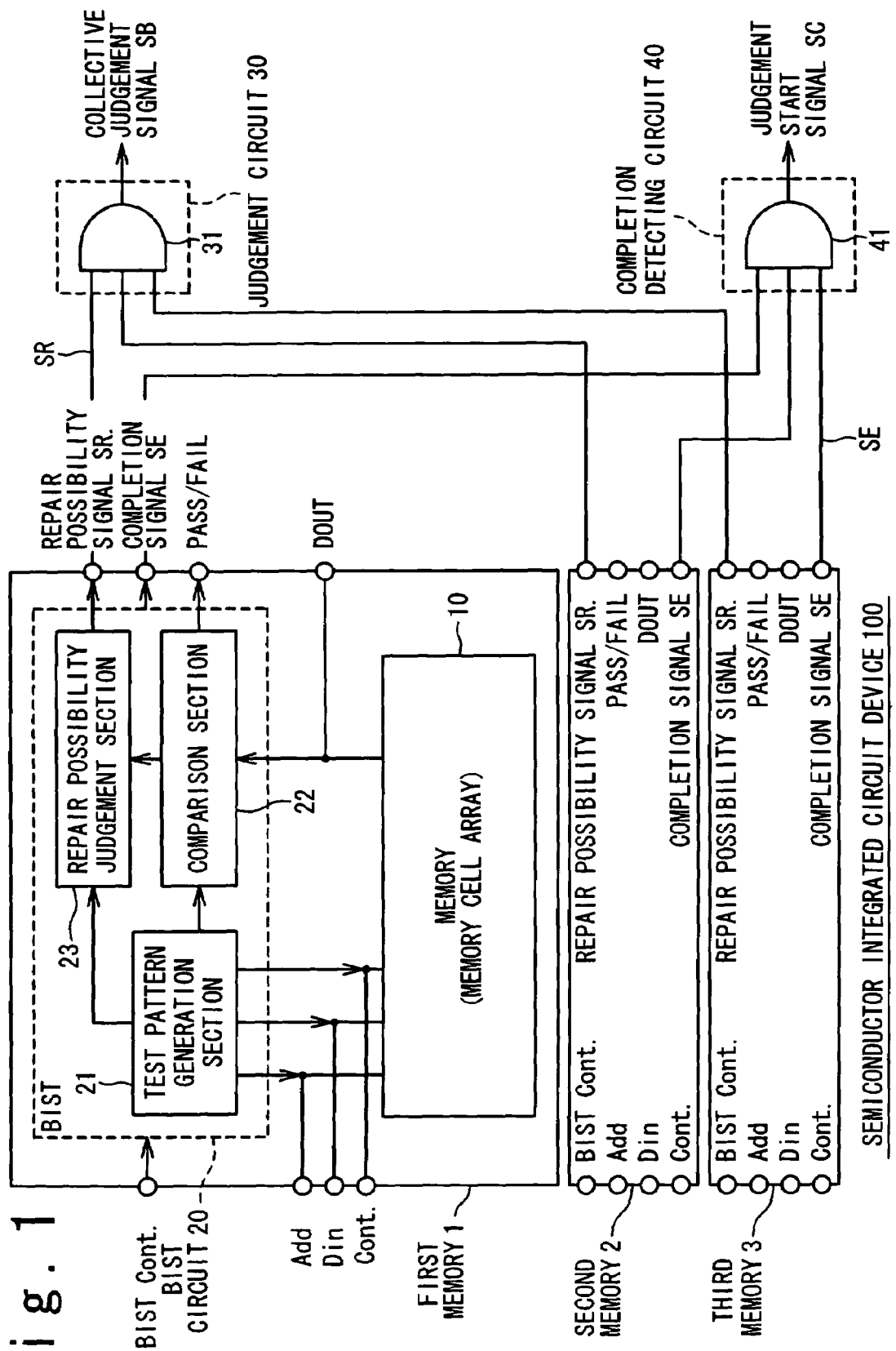
FIG. 1 is a block diagram showing a configuration of a semiconductor integrated circuit device of the present invention.

FIG. 1 is a block diagram showing a configuration of a semiconductor integrated circuit device of the present invention. A semiconductor integrated circuit device 100 includes a plurality of memory sections, and a judgement circuit 30 and a completion detecting circuit 40. Each of the judgement circuit 30 and the completion detecting circuit 40 is connected to the plurality of memory sections. In FIG. 1, a first memory 1, a second memory 2, and a third memory 3 are shown as examples of the plurality of memory sections.

Each of the plurality of memory sections (1, 2, and 3) has a BIST (Built-in Self Test) function. That is, each of the first memory 1, the second memory 2 and the third memory 3 has a memory (memory cell array) 10, and a BIST circuit 20 for automatically inspecting the memory 10. Thus, in this specification, a memory having the BIST function may simply be referred to as a "memory". In that case, the memory (1, 2, and 3) includes not only the memory cell array 10 and a driver but also the BIST circuit 20.

The memory cell array 10 is activated by a given control signal Cont. An input data Din is written to a memory cell of the memory cell array 10 corresponding to an address specified by an address signal Add. An output data Dout is read from the memory cell of the memory cell array 10 corresponding to the address specified by the address signal Add. The memory cell array 10 of the present invention has a redundant cell array (a redundant cell group: not shown). A redundant cell (not shown) is connected to a redundant word line (a repair word line: not shown) and/or a redundant bit line (a repair bit line: not shown). By replacing a word line or bit line connected to a defective memory cell with the redundant word line or redundant bit line, the defective memory cell is repaired (replaced). Then, a yield of a memory is improved.

The BIST circuit 20 of the present invention has a "repair possibility judgement function" for judging whether the above defective memory cell is repairable or not. In other words, the BIST circuit 20 examines a possibility of repairing a defect, and outputs a "repair possibility signal SR" that shows the possibility. To be more precise, the BIST circuit 20 detects the number and address of defective cell groups in the memory cell array 10, and judges whether or not a defective cell group can be replaced with the above redundant cell group. Then, the BIST circuit 20 outputs the judgement result as the repair possibility signal SR.

The BIST circuit 20 includes a test pattern generation section 21, a comparison section 22, and a repair possibility judgement section 23. If a BIST control signal (BIST Cont.) is supplied, the BIST circuit 20 is activated, and the test pattern generation section 21 generates a given test pattern for the memory cell array 10. The test pattern includes a combination of an address data, a write command, a read command and a test data. The test data is written to a memory cell indicated by the address data, and a data is read from the memory cell. The read output data is supplied to the comparison section 22 of the BIST circuit 20.

The comparison section 22 receives the test pattern from the test pattern generation section 21. The comparison section 22 judges whether the memory cell is defective or not, by comparing an expected value expected from the test pattern with the output data from the memory cell. If detecting a defect of a memory cell, the comparison section 22 outputs a detection signal indicating the detection of the defect, to the repair possibility judgement section 23. By receiving an address data of that time from the test pattern generation section 21, the repair possibility judgement section 23 can know an address of a defective cell where a defect is detected. The above operation is repeated for the number of test patterns set in advance.

Figure 2:
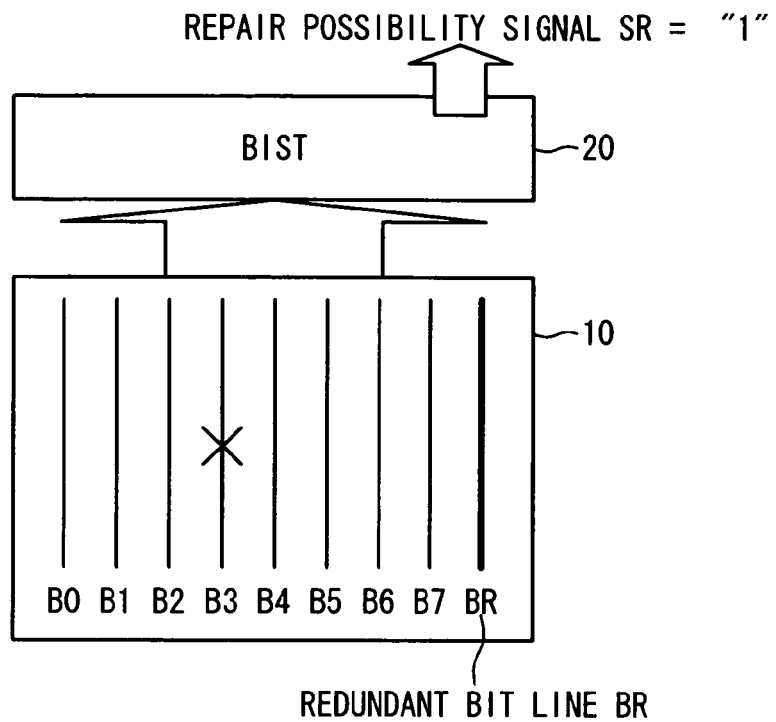
FIG. 2 is a schematic diagram showing a method of judging repair possibility.
Figure 3:
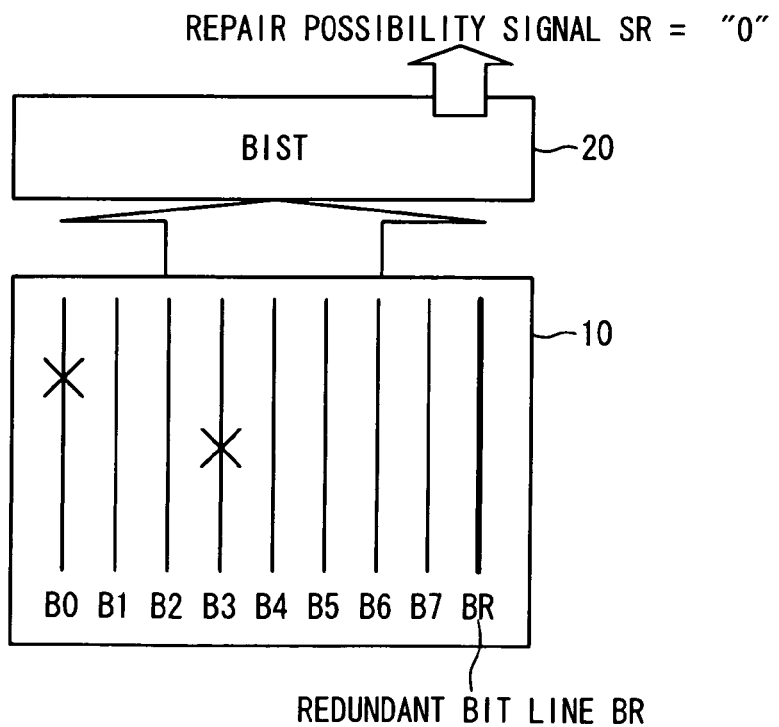
FIG. 3 is a schematic diagram showing a method of judging repair possibility.

Based on the number and addresses of defective cell groups where a defect is detected, the repair possibility judgement section 23 judges whether or not a defective cell group can be replaced with a redundant cell group. Then, the repair possibility judgement section 23 outputs the judgement result as the repair possibility signal SR. FIGS. 2 and 3 are schematic diagrams showing a method of judging repair possibility. For simplification, eight bit lines B0 to B7, and one redundant bit line BR are shown in the examples of FIGS. 2 and 3. The number of redundant bit lines is not limited to one. Additionally, a redundant word line may be used instead of a redundant bit line.

In the example shown in FIG. 2, a defective bit group is detected only on the single bit line B3 as a result of a test by the BIST circuit 20. Since the defective bit group is present only on the single bit line B3, it is "possible" to repair the memory by replacing the bit line B3 with the redundant bit line BR. Therefore, the repair possibility judgement section 23 outputs "1" as the repair possibility signal SR. On the other hand, in the example shown in FIG. 3, defective bit groups are detected on the two bit lines B0 and B3, respectively, as a result of a test by the BIST circuit 20. Since the defective bit groups are present on the two bit lines B0 and B3, the defective bit lines cannot be replaced with the single redundant bit line BR. That is to say, it is "impossible" to repair the memory. Then, the repair possibility judgement section 23 outputs "0" as the repair possibility signal SR.

In inspecting a memory, it is detected whether a trouble is present with respect to a memory as a whole by making the above BIST circuit 20 operate. The BIST circuit 20 outputs a Pass signal when a trouble is absent in an inspected memory, and outputs a Fail signal when a trouble is present. Further, the BIST circuit 20 of the present invention outputs the repair possibility signal SR indicating whether the trouble can be repaired by the redundancy (the redundant cell array). According to the semiconductor integrated circuit device 100 of the present invention, the repair possibility signal SR outputted from all the memories (1, 2, and 3), is inputted to the judgement circuit 30.

The judgement circuit 30 receives the repair possibility signal SR from each of the plurality of memories (1, 2, and 3), and judges whether or not all the memories can be repaired based on a plurality of repair possibility signals SR. That is, the judgement circuit 30 collectively judges whether a plurality of memories is repairable. Then, the judgement circuit 30 outputs a collective judgement signal SB indicating a result of the collective judgement, to the outside. For example, the judgement circuit 30 may include an AND circuit 31. Input of the AND circuit 31 is a plurality of repair possibility signals SR, as shown in FIG. 1. In this case, "1" is outputted as the collective judgement signal SB when all the memories are repairable (all the repair possibility signal="1"). When any of the memories is not repairable (any of the repair possibility signal="0"), "0" is outputted as the collective judgement signal SB.

Also, "0" may be outputted as the repair possibility signal SR when the repair is possible, and "1" may be outputted as the repair possibility signal SR when the repair is impossible. In that case, the judgement circuit 30 may include an OR circuit, input of the OR circuit being a plurality of repair possibility signals SR. In this case, "0" is outputted as the collective judgement signal SB when all the memories are repairable (all the repair possibility signal="0"). When any of the memories is not repairable (any of the repair possibility signal="1"), "1" is outputted as the collective judgement signal SB.

A tester connected to the semiconductor integrated circuit 100 can detect the collective judgement signal SB, and judge whether the semiconductor integrated circuit 100 is a non-defective product or a defective product.

In some cases, one of the plurality of memories (1, 2, and 3) shown in FIG. 1 may have a different memory size from others. Also, in some cases, one of the plurality of memories (1, 2, and 3) may have a different operation speed from others. In these cases, a time for completing a BIST test differs according to a memory. It is necessary to wait the result of the BIST for each of the memories, to collectively judge the repair possibility for a plurality of memories. For this reason, the BIST circuit 20 of the present invention may output a completion signal SE ("1") to the outside, when the BIST test is completed. In the case of a conventional BIST circuit, such a completion signal SE is used inside the BIST circuit, and Pass/Fail signals are outputted in response to the completion signal. In the present invention, the completion signal SE may be outputted to the outside as well.

As shown in FIG. 1, the completion signal SE outputted from each memory (BIST circuit 20) is supplied to the completion detecting circuit 40. The completion detecting circuit 40 outputs a judgment start signal SC, when the BIST test is completed in all the memories. For example, the completion detecting circuit 40 includes an AND circuit that receives the completion signal SE from a plurality of memories. When the completion signal SE ("1") is received from all the memories, "1" is outputted as the judgement start signal SC. The tester connected to the semiconductor integrated circuit 100 can make a judgement of a non-defective product or a defective product in response to the judgement start signal SC.

Figure 4:
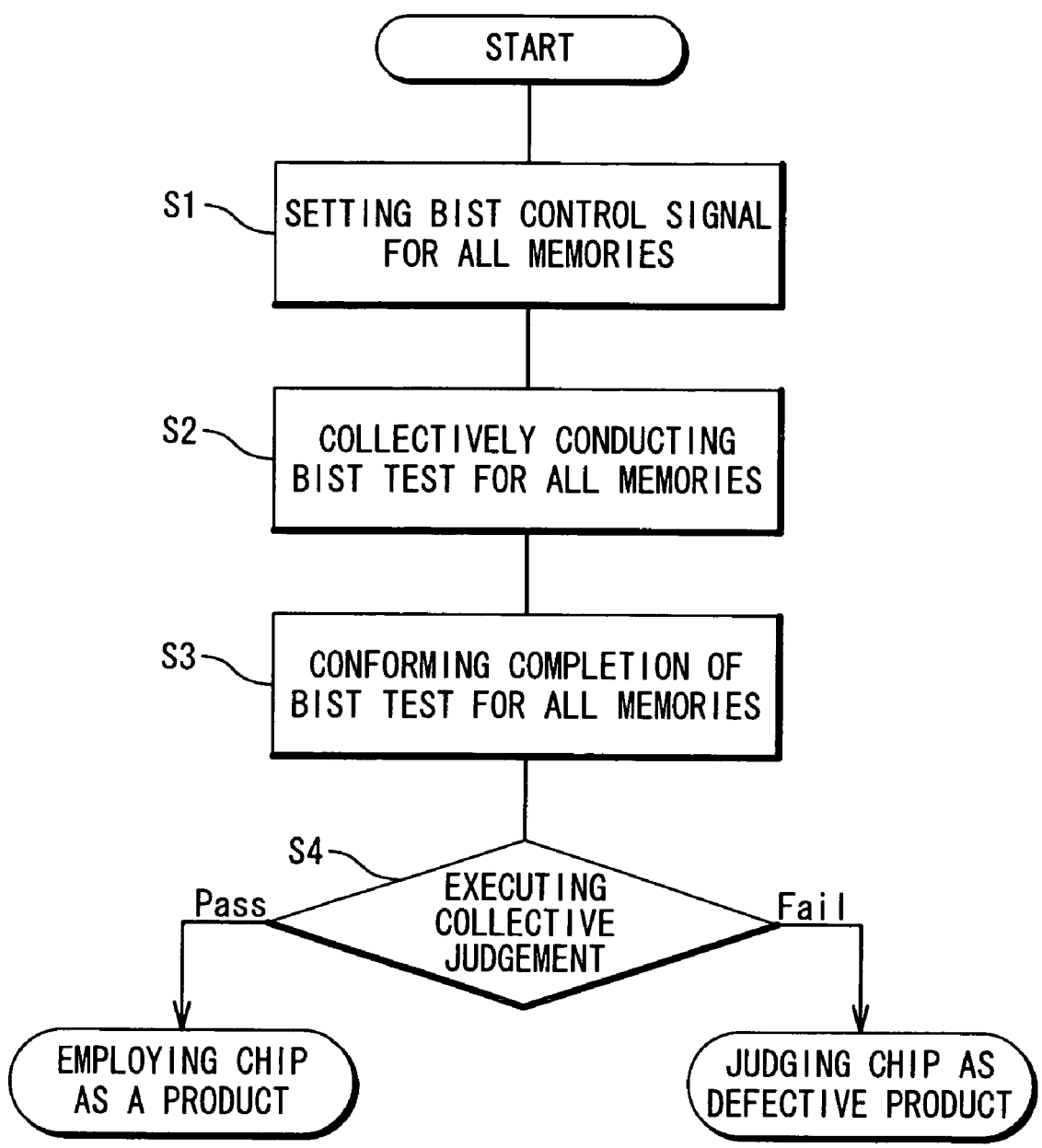
FIG. 4 is a flow chart showing an inspection method of the semiconductor integrated circuit device of the present invention.

FIG. 4 is a flow chart briefly showing an inspection method of the semiconductor integrated circuit device 100 of the present invention. In the case where an inspection for a certain chip is conducted, the BIST control signal (BIST Cont.) is set for all the memories included in the chip (step S1). Consequently, all the BIST circuits 20 are activated, and the BIST test is collectively conducted for all the memories (step S2). If a defective cell group is judged not to be repairable in a certain memory, the BIST test for the memory is ended at that time. If the completion signal SE is outputted from all the memories, the judgement start signal SC is outputted from the completion detecting circuit 40 (step S3). In response to the judgement start signal SC, the tester examines the collective judgement signal SB (step S4). When repair is possible with respect to the semiconductor integrated circuit device 100 as a whole (step S4; Pass), the semiconductor integrated circuit device 100 is employed as a product. When repair is impossible with respect to the semiconductor integrated circuit device 100 as a whole (step S4; fail), the semiconductor integrated circuit device 100 is judged to be a defective product, and a test for the next chip is conducted.

Thus, the memories (1, 2, and 3) of the present invention have the repair possibility judgement function, and the repair possibility of all the memories is collectively judged. Consequently, a test time of a memory is reduced. The number of memories built into a single semiconductor chip is increasing in recent years, the number reaching 100 to 200 in some cases. According to the present invention, the BIST test is simultaneously conducted for all the memories, and the repair possibility of all the memories is collectively judged. Since it is not necessary to conduct a test of a memory separately for each memory, time for the inspection is reduced. Further, the semiconductor integrated circuit device 100 of the present invention has the completion detecting circuit 40, making it possible to respond to a plurality of memories having different completion times of the BIST test.

Figure 5:
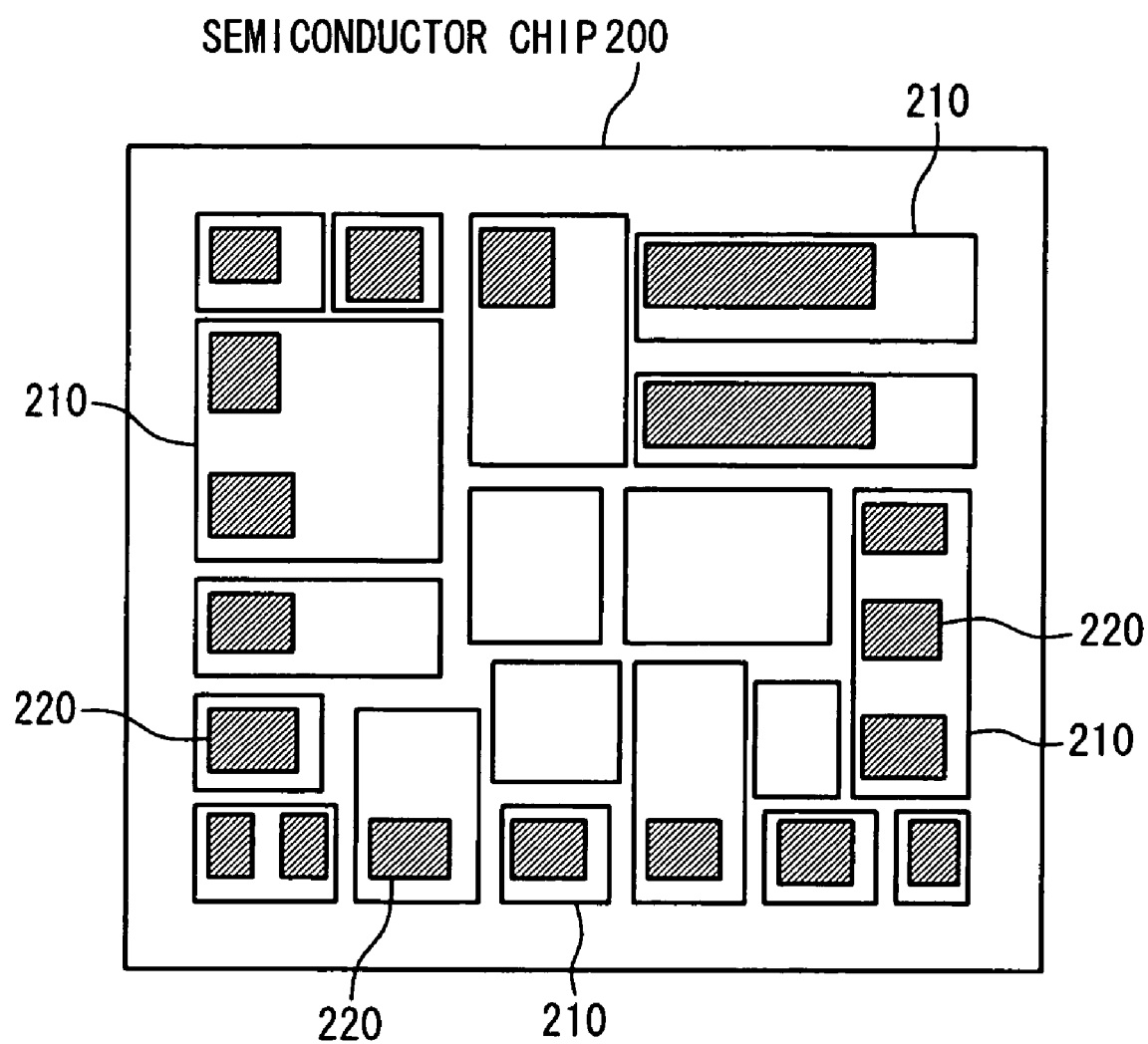
FIG. 5 is a schematic view showing a configuration of a semiconductor integrated circuit device of the present invention.

FIG. 5 is a schematic view showing a configuration of a semiconductor integrated circuit device 100 provided with a plurality of memories having different memory sizes. The semiconductor integrated circuit device 100 is an ASIC (Application Specific Integrated Circuit) for example. According to the ASIC, a plurality of function blocks 210 is included in a single semiconductor chip 200, as shown in FIG. 5. In the ASIC, such a plurality of function blocks 210 is formed in the chip in advance, provided as a foundation layer. Routing (of interconnections) based on a user's design is performed to a customizing layer on the foundation layer, completing a desired LSI. Function blocks including a memory 220 are present in the plurality of function blocks 210. The memory size of the memory 220 differs depending on what function the function block 210 having the memory 220 realizes. In other words, the semiconductor chip 200 includes a plurality of memories 220 that have different memory sizes, then possible of having different BIST test times. Therefore, it is preferable that the present invention is applied.

Figure 6:
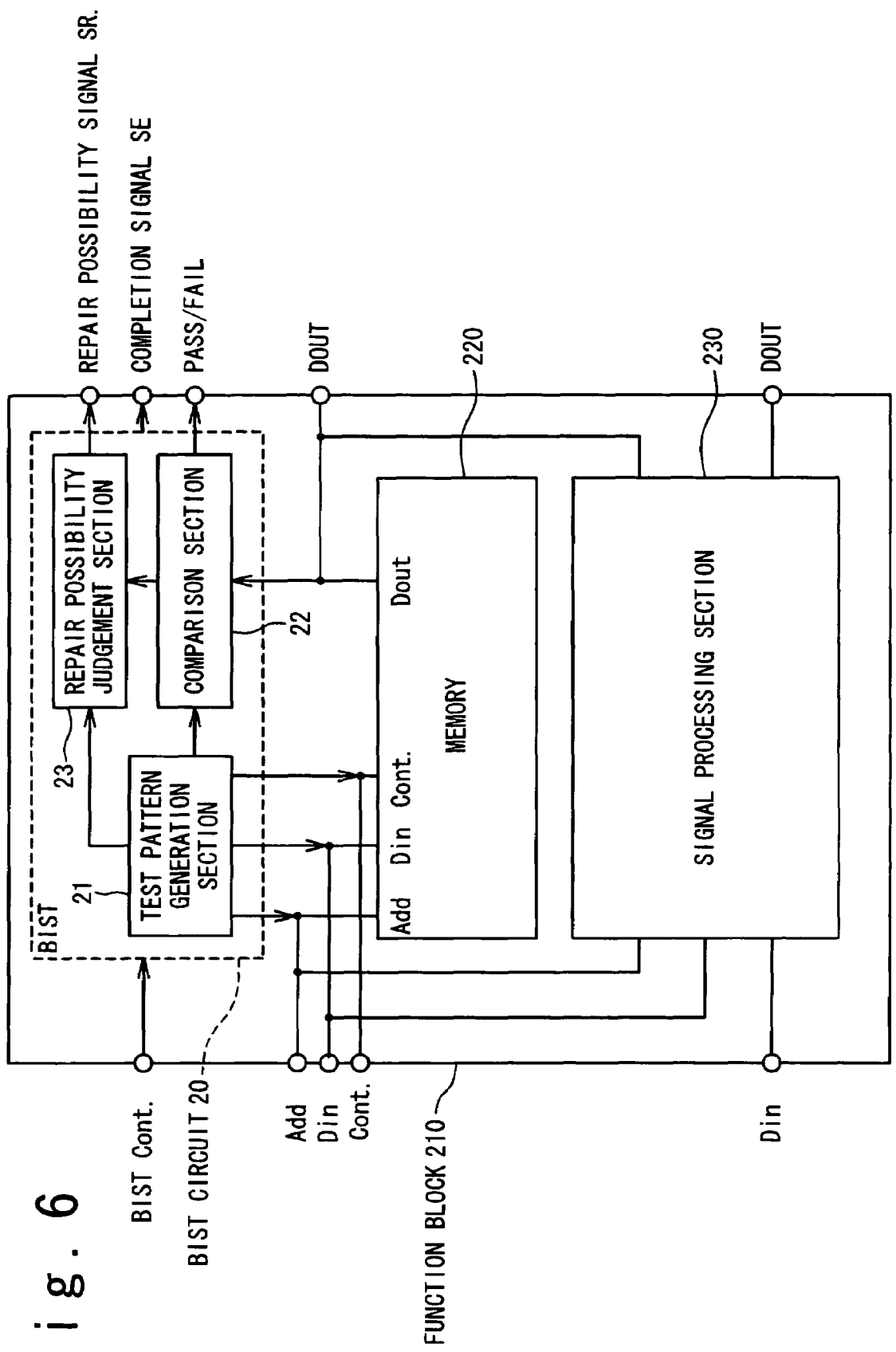
FIG. 6 is a block diagram showing a configuration of a function block of the present invention.

FIG. 6 is a block diagram showing a configuration of a function block 210 to which the present invention is applied. The function block 210 has the BIST circuit 20 of the present invention, in addition to the memory 220 and a signal processing section 230 that realizes a given function. As stated above, the BIST circuit 20 has the repair possibility judgement function. A plurality of repair possibility signals SR outputted from each of the plurality of function blocks 210 is supplied to the judgement circuit 30 shown in FIG. 1. The judgement circuit 30 collectively makes repair possibility judgement for a plurality of function blocks 210. The judgement circuit 30 is provided in the semiconductor chip 200, and outputs the collective judgement signal SB indicating the result of the collective judgement, from a pad provided to the semiconductor chip 200 to the outside.

Also, the BIST circuit 20 may output the completion signal SE to the outside, when the BIST test is completed. As shown in FIG. 1, the completion signal SE outputted from each function block 210 (BIST circuit 20) is supplied to the completion detecting circuit 40. The completion detecting circuit 40 is provided in the semiconductor chip 200, and outputs the judgement start signal SC indicating completion of the BIST test in all the memories, from the pad provided to the semiconductor chip 200 to the outside. The tester connected to the semiconductor chip 200 can make a judgement of a non-defective product and a defective product in response to the judgement start signal SC.

According to the semiconductor integrated circuit device 100 and the inspection method of the same of the present invention, repair possibility of all the memories is collectively judged as explained above. Consequently, the test time of the memory is reduced. The number of memories provided on a single semiconductor chip is increasing in recent years, the number reaching 100 to 200 in some cases. According to the present invention, the BIST test is simultaneously conducted for all the memories, and the repair possibility of all the memories is collectively judged. Time for inspection is reduced, since it is not necessary to conduct the test of the memory separately for each memory. Further, the semiconductor integrated circuit device 100 of the present invention is provided with the completion detecting circuit 40, making it possible to respond to a plurality of memories having different completion times of the BIST test.

It is apparent that the present invention is not limited to the above embodiment, that may be modified and changed without departing form the scope and spirit of the invention.

What is claimed is:

1. A semiconductor integrated circuit device, comprising:
a plurality of memories, each of the plurality of memories comprising a Built-in Self Test (BIST) circuit that examines a possibility of repairing a defect and outputs a repair possibility signal indicating said possibility; and
a judgment circuit configured to receive the repair possibility signals from each of the plurality of memories and to judge whether all of said plurality of memories can be repaired based on a plurality of said repair possibility signals,
wherein said BIST circuit comprises a repair possibility judgment section that outputs said repair possibility signal to the judgment circuit.

2. The semiconductor integrated circuit device according to claim 1, wherein said judgment circuit includes an AND circuit which receives said plurality of the repair possibility signals from said plurality of memories.

3. The semiconductor integrated circuit device according to claim 1, wherein said judgment circuit includes an OR circuit which receives said plurality of the repair possibility signals from said plurality of memories.

4. The semiconductor integrated circuit device according to claim 1, wherein each of said plurality of memories includes redundant cells, and
wherein said BIST circuit judges whether defective cells can be replaced with said redundant cells, and outputs a judgment result as said repair possibility signal.

5. The semiconductor integrated circuit device according to claim 4, wherein said BIST circuit includes:
a test pattern generation section configured to generate a test pattern for memory cells in each of said plurality of memories; and
a comparison section configured to judge whether said memory cells are defective, by comparing an expected value expected from said test pattern with output data from said memory cells,
wherein said repair possibility judgment section performs said judgment based on a number and addresses of defective cells where a defect is detected, and outputs said repair possibility signal.

6. The semiconductor integrated circuit device according to claim 1, further comprising:
a completion detecting circuit configured to be connected to said plurality of memories,
wherein said BIST circuit outputs a completion signal to said completion detecting circuit when a test for examining said possibility is completed, and
wherein said completion detecting circuit outputs a judgment start signal when receiving said completion signal from all of said plurality of memories.

7. The semiconductor integrated circuit device according to claim 6, wherein said plurality of memories includes at least two memories, one of said at least two memories has a different memory size from other.

8. The semiconductor integrated circuit device according to claim 6, wherein said completion detecting circuit includes an AND circuit configured to receive said completion signal from said all of the plurality of memories.

9. A semiconductor integrated circuit device, comprising:
a plurality of function blocks configured to be provided on a chip;
a plurality of memories, each of which is configured to be included in one of said plurality of function blocks; and
a judgment circuit configured to be connected to said plurality of memories,
wherein each of said plurality of memories includes a Built-in Self Test (BIST) circuit that examines a possibility of repairing a defect and outputs a repair possibility signal indicating said possibility,
wherein said judgment circuit judges whether all of said plurality of memories can be repaired based on a plurality of said repair possibility signals, each of which is outputted from one of said plurality of memories, and
wherein said BIST circuit comprises a repair possibility judgment section that outputs said repair possibility signal to the judgment circuit.

10. The semiconductor integrated circuit device according to claim 9, wherein said judgment circuit includes an AND circuit which receives said plurality of the repair possibility signals from said plurality of memories.

11. The semiconductor integrated circuit device according to claim 9, wherein said judgment circuit includes an OR circuit which receives said plurality of the repair possibility signals from said plurality of memories.

12. The semiconductor integrated circuit device according to claim 9, wherein each of said plurality of memories includes redundant cells, and
wherein said BIST circuit judges whether defective cells can be replaced with said redundant cells, and outputs a judgment result as said repair possibility signal.

13. The semiconductor integrated circuit device according to claim 12, wherein said BIST circuit includes:
a test pattern generation section configured to generate a test pattern for memory cells in each of said plurality of memories; and
a comparison section configured to judge whether said memory cells are defective, by comparing an expected value expected from said test pattern with output data from said memory cells, and
wherein said repair possibility judgment section performs said judgment based on a number and addresses of defective cells where a defect is detected, and outputs said repair possibility signal.

14. The semiconductor integrated circuit device according to claim 9, further comprising:
a completion detecting circuit configured to be connected to said plurality of memories,
wherein said BIST circuit outputs a completion signal to said completion detecting circuit when a test for examining said possibility is completed, and
wherein said completion detecting circuit outputs a judgment start signal when receiving said completion signal from all of said plurality of memories.

15. The semiconductor integrated circuit device according to claim 14, wherein said plurality of memories includes at least two memories, one of said at least two memories has a different memory size from other.

16. The semiconductor integrated circuit device according to claim 14, wherein said completion detecting circuit includes an AND circuit configured to receive said completion signal from said all of the plurality of memories.

17. The semiconductor integrated circuit device according to claim 14, wherein said completion detecting circuit is provided on said chip.

18. The semiconductor integrated circuit device according to claim 17, wherein said completion detecting circuit outputs said judgment start signal to outside of said chip through a pad in said chip.

19. An inspection method of a semiconductor integrated circuit device, said method comprising:
providing a semiconductor integrated circuit device which includes a plurality of memories, wherein each of said plurality of memories includes a Built-in Self Test (BIST) circuit that examines a possibility of repairing a defect and outputs a repair possibility signal indicating said possibility;
activating said BIST circuit included in all of said plurality of memories;
receiving a plurality of repair possibility signals, each of which is outputted from one of said plurality of memories; and
collectively judging whether said semiconductor integrated circuit device can be repaired based on said received plurality of repair signals.

20. The inspection method of a semiconductor integrated circuit device according to claim 19, further comprising judging a completion of a Built-in Self Test (BIST) in all of said plurality of memories,
   wherein said judging the completion of the BIST is executed between said activating said BIST circuit and said collectively judging.

21. The inspection method according to claim 19, further comprising outputting a collective judgment signal indicating a result of said collective judgment.

22. The semiconductor integrated circuit device according to claim 9, further comprising a signal processing section configured to perform a predetermined function by using the signal processing section in addition to the memory and said BIST circuit.

* * * * *